United States Patent
Park et al.

(10) Patent No.: US 7,015,512 B2
(45) Date of Patent: Mar. 21, 2006

(54) HIGH POWER FLIP CHIP LED

(75) Inventors: Young Ho Park, Kyungki-do (KR); Hun Joo Hahm, Kyungki-do (KR); Seung Jin Yoo, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 80 days.

(21) Appl. No.: 10/852,437

(22) Filed: May 25, 2004

(65) Prior Publication Data

US 2005/0133795 A1   Jun. 23, 2005

(30) Foreign Application Priority Data

Dec. 20, 2003   (KR)   ............... 10-2003-0094303

(51) Int. Cl.
   *H01L 33/00*   (2006.01)
(52) U.S. Cl. .................................. 257/99; 257/773
(58) Field of Classification Search .............. 257/99, 257/773, 623, 778
   See application file for complete search history.

(56) References Cited

U.S. PATENT DOCUMENTS 6,573,537 B1   6/2003   Steigerwald et al.
2005/0133795 A1 *   6/2005   Park et al. ............. 257/79

* cited by examiner

*Primary Examiner*—Mark V. Prenty
(74) *Attorney, Agent, or Firm*—Lowe Hauptman & Berner, LLP (57) ABSTRACT

A high power flip chip LED has an n-doped semiconductor layer formed on the sapphire substrate, with a plurality of first regions and a second region of intersecting lines for separating the first regions from each other. P-doped semiconductor layers are on the first regions of the n-doped semiconductor layer to form mesa structures. At least one pair of diagonal corners of the respective mesa structures are rounded inward to form first basins between adjacent inward-rounded corners. First metal layers are on the mesa structures in a same configuration. A second metal layer is on the second region of the n-doped semiconductor layer. First ohmic contacts are on the first metal layers. Second ohmic contacts are on the second metal layer in the first basins. The LED can prevent the current channeling to increase the luminous area while equalizing the current density area thereby generating high brightness light.

13 Claims, 9 Drawing Sheets

PRIOR ART

FIG. 8I

HIGH POWER FLIP CHIP LED

BACKGROUND OF THE INVENTION

1. Field of the Invention

The present invention relates to a high power flip chip LED, more particularly, which can prevent the current channeling to increase the luminous area while equalizing the current density across the luminous area thereby generating high brightness light.

2. Description of the Related Art

A Light Emitting Diode (LED) basically consists of a junction of p- and n-doped semiconductor layers formed on a sapphire substrate as a kind of optoelectric device. When applied with electric current, the LED generates light converted from a predetermined level of energy corresponding to its band gap through the electron-hole re-combination.

People have become familiar with LEDs of this type as they are adopted in displays of general electronic instruments. Although early stage LEDs were limited in the brightness and color, various high brightness LEDs are produced at present according to advanced materials and improved manufacturing technologies, emitting full colors of lights including white light in the visible band. The LEDs of high brightness, high efficiency and various colors are being widely utilized in many countries for various displays such as a large-sized electronic display board, an exit lamp, a traffic lamp and a vehicle lamp. The LEDs are expected to be applied to wider fields in the future since they are small, light and endurable while having a long lifetime.

The color emitted from an LED is determined by the component of its semiconductor material. Common examples of the semiconductor material for LEDs include ZnSe, nitrides such as GaN, InN and AlN and nitride compounds containing nitrides mixed at certain contents. In particular, GaN is most widely used.

The growth of GaN crystal is generally carried out via the Metal Organic Chemical Vapor Deposition (MOCVD). The MOCVD typically flows organic compound reactant gas into a reactor at a temperature of about 700 to 1200° C. to grow an epitaxial layer on a substrate, which is generally made of sapphire ($Al_2O_3$) or Silicon Carbide (SiC). For the purpose of promoting fine crystal growth, a low temperature buffer layer is formed between the substrate and the nitride layer at a thickness of about 20 to 30 nm to prevent the stress originated from the lattice constant mismatch in the growth of the nitride or epitaxial layer on the sapphire or SiC substrate.

As applied to various fields, and more particularly, to illuminators, present LEDs are required to have higher brightness, larger chip dimension and larger luminous area. Accordingly, various flip chip structures have been developed to realize larger luminous area as well as higher brightness.

Figure 1:
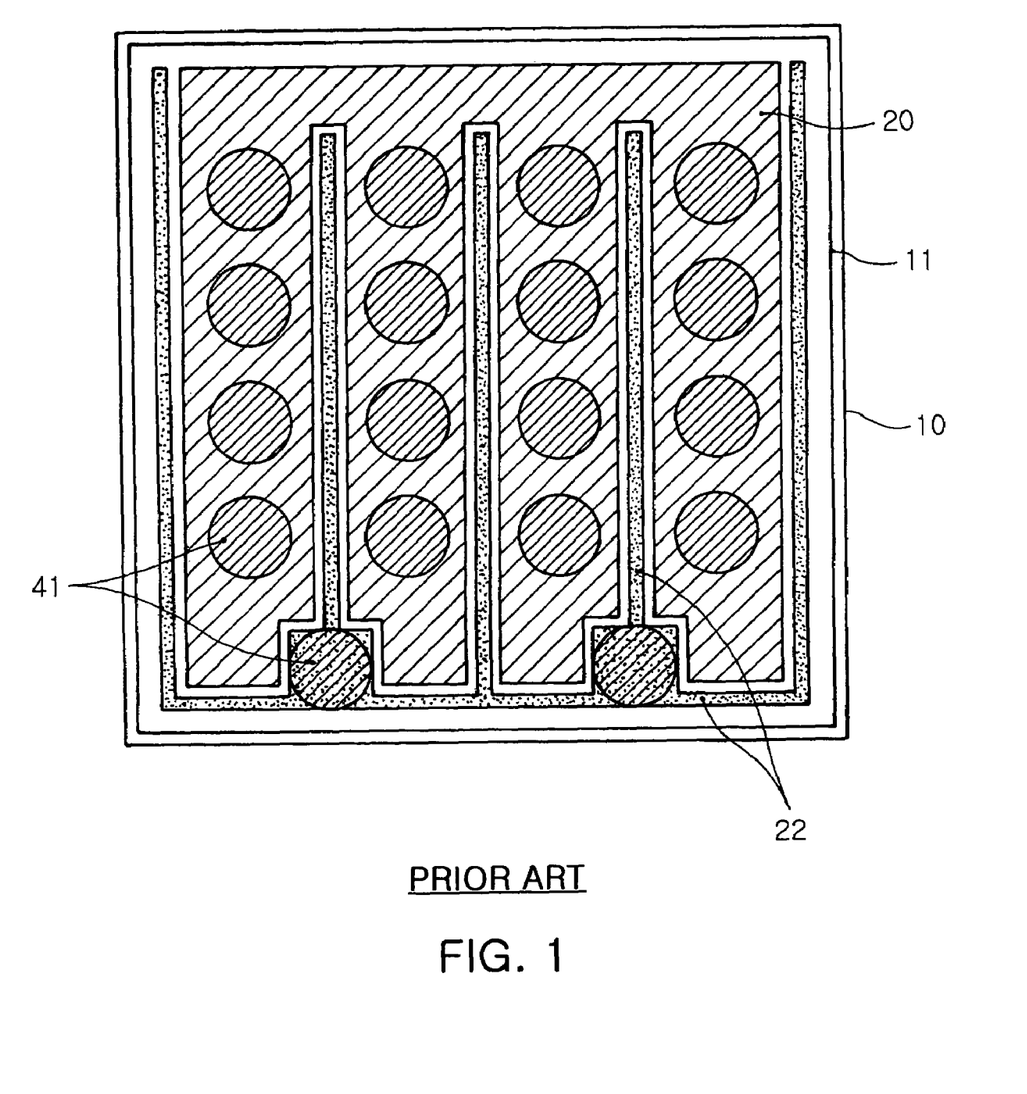
FIG. 1 is a plan view illustrating a flip chip LED of the prior art.

FIG. 1. illustrates an example of a flip chip LED disclosed in the U.S. Pat. No. 6,573,537. Referring to FIG. 1, an n-doped epitaxial layer or n-doped semiconductor layer 11 is formed on a transparent substrate or superstrate 10, and a p-doped semiconductor layer (not shown) is formed on a first or major region of the n-doped semiconductor layer 11. A p-electrode 20 is formed on a first or major region of the p-doped semiconductor layer, and an-electrode 22 is formed on a second or minor region of the n-doped semiconductor layer 11 and a second or minor region of the p-doped semiconductor layer. The electrodes 20 and 22 are connected with a power supply via conductive contacts 41. The n-electrode 22 is in the form of fingers interposing the p-electrode to prevent current channeling.

However, the above LED structure of the prior art has the following drawbacks. That is, the thin fingers of the p-electrode 22 are extended interposing the wide p-electrode 22, and supplied with current via the conductive contacts 41 disposed at lower ends of the p-electrode fingers. In this circumstance, because the p-electrode fingers are very thin, the current density applied to upper ends of the p-electrode fingers is smaller than that applied to lower ends thereof. This makes the current density across the LED ununiform and also the emission ununiform.

In order to solve this drawback, there was proposed a structure that conductive contacts are disposed at both ends of p-electrode fingers. However, this structure also fails to sufficiently solve the ununiformity of the current density across the LED.

SUMMARY OF THE INVENTION

The present invention has been made to solve the foregoing problems and it is therefore an object of the present invention to provide a high power flip chip LED which can prevent the current channeling to increase the luminous area while equalizing the current density across the luminous area thereby generating high brightness light.

According to an aspect of the invention for realizing the object, there is provided a high power flip chip Light Emitting Diode (LED) comprising: a rectangular sapphire substrate; an n-doped semiconductor layer formed on the sapphire substrate, and having a plurality of first regions and a second region of intersecting lines extended through the first regions to separate the first regions from each other; a plurality of p-doped semiconductor layers formed respectively on the first regions of the n-doped semiconductor layer to form mesa structures having corners, at least one pair of diagonal corners of the respective mesa structures being rounded inward to form first basins between adjacent inward-rounded corners; first metal layers formed respectively on the mesa structures in a same configuration; a second metal layer formed on the second region of the n-doped semiconductor layer; a plurality of first ohmic contacts formed respectively on the first metal layers; and a plurality of second ohmic contacts formed respectively on the second metal layer in the first basins.

It is preferred that remaining corners of the mesa structures are rounded to form second basins, wherein the first and second basins have a same radius, or the first basins have a same radius and the second basins have a same radius.

It is preferred that the first metal layers are configured symmetric about each pair of diagonal corners.

It is also preferred that the second metal layer is integrally formed around the first metal layers.

In addition, the sapphire substrate may be replaced by one selected from a group including a SiC substrate, an oxide substrate and a carbide substrate.

According to another aspect of the invention for realizing the object, there is provided a high power flip chip Light Emitting Diode (LED) comprising: a rectangular sapphire substrate; an n-doped semiconductor layer formed on the sapphire substrate, and having a plurality of first regions and a second region of intersecting lines extended through the first regions to separate the first regions from each other; a plurality of p-doped semiconductor layers formed respectively on the first regions of the n-doped semiconductor layer to form mesa structures having corners, all of the corners being rounded inward to form basins; first metal layers formed respectively on the mesa structures in a same configuration; a second metal layer formed on the second region of the n-doped semiconductor layer; a plurality of first ohmic contacts formed respectively on the first metal layers; and a plurality of second ohmic contacts formed respectively on the second metal layer in the first basins.

It is preferred that the basins have a same radius.

It is preferred that the first metal layers are configured symmetric about each pair of diagonal corners.

It is also preferred that the second metal layer is integrally formed around the first metal layers.

In addition, the sapphire substrate may be replaced by one selected from a group including a SiC substrate, an oxide substrate and a carbide substrate.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 2:
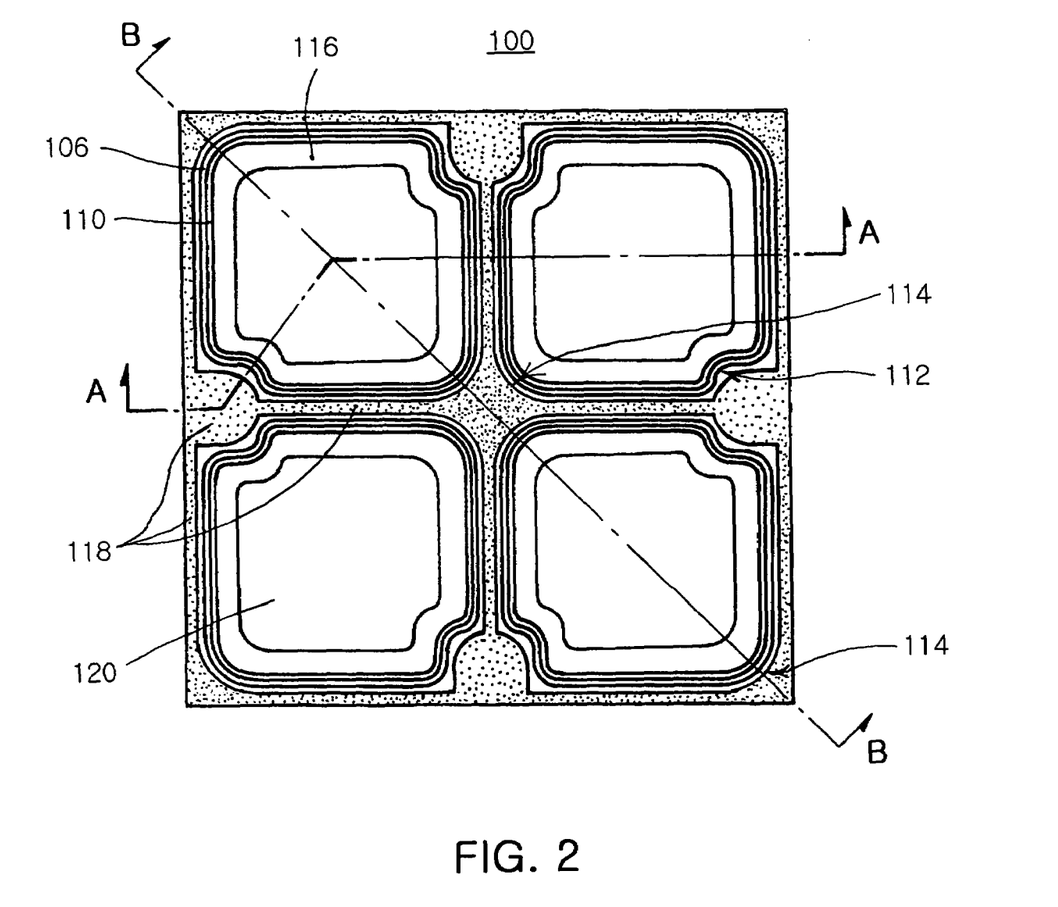
FIG. 2 is a plan view illustrating a flip chip LED according to a first embodiment of the invention.
Figure 3:
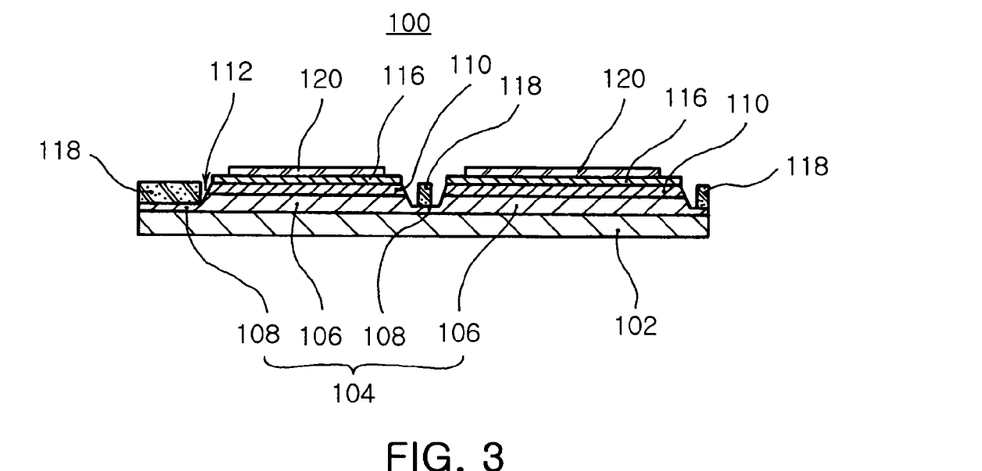
FIG. 3 is a sectional view taken along a line A—A in FIG. 2.
Figure 4:
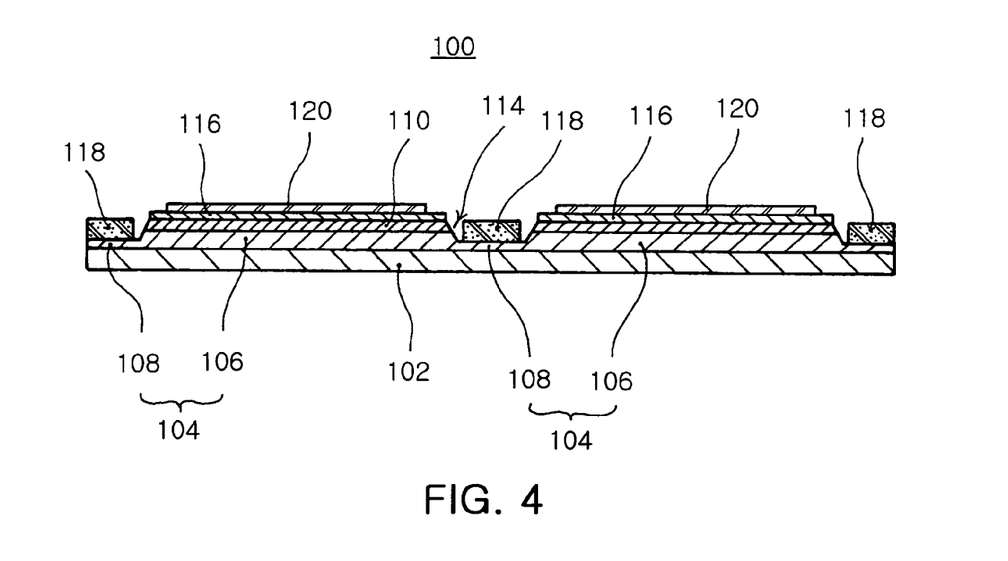
FIG. 4 is a sectional view taken along a line B—B in FIG. 2.

FIG. 2 is a plan view illustrating a flip chip LED according to a first embodiment of the invention, FIG. 3 is a sectional view taken along a line A—A in FIG. 2, and FIG. 4 is a sectional view taken along a line B—B in FIG. 2.

Referring to FIGS. 2 to 4, a flip chip LED 100 according to the first embodiment of the invention includes a substantially rectangular substrate 102, an n-doped semiconductor layer 104 formed on the substrate 102, a plurality of p-doped semiconductor layers 110 formed on first regions 106 of the n-doped semiconductor layer 104, a plurality of first metal layers 116 formed on the p-doped semiconductor layers 110, separated from one another, a second metal layer 118 formed on the second region 108 of the n-doped semiconductor layer 104, a plurality of p-contacts 120 formed respectively on the first metal layers 116 and a plurality of n-contacts formed in predetermined positions on the second metal layer 118 (corresponding to first basins 112).

The rectangular substrate 102 is made of transparent material such as sapphire, Silicon Carbide (SiC), oxide and carbide, and covered with the n-doped semiconductor layer 104.

The n-doped semiconductor layer 104 is grown on the substrate 102 via for example vapor deposition, and preferably by the growth of n-doped GaN. There is typically formed a buffer layer (not shown) between the substrate 102 and the n-doped semiconductor layer 104 to reduce the stress originated from the lattice constant mismatch between the same.

There are the p-doped semiconductor layers 110 on the first region 106 of the n-doped semiconductor layer 104. The p-doped semiconductor layers 110 are formed on the first region 106 of the n-doped semiconductor layer 104 preferably via vapor deposition, in particular, by the growth of GaN. The p-doped semiconductor layers 110 together with the first region 106 of the n-doped semiconductor layer 104 form mesa structures that are elevated at a substantially rectangular configuration. Herein the term "mesa structures" will be used to indicate the elevated structures defined by the first regions 106 of the n-doped semiconductor layers 104 and the p-doped semiconductor layers 110, and to refer to the first regions 106 and the p-doped semiconductor layers 110 in common.

Although it is illustrated that the first regions 106 of the n-doped semiconductor layer 104 are elevated over the second region 108 of the n-doped semiconductor layer 104, this geometry is not indispensable, but the first regions 106 may be formed substantially flush with the second region 108. That is, this geometry requires only that the second region 108 not be covered with the p-doped semiconductor layers 110 so that the second metal layer 118 can be formed directly on the second region 108.

As not shown in the drawings, active regions are formed between the n-doped semiconductor layer 104 and the p-doped semiconductor layers 110. The active regions for emitting light are formed by the growth of quantum wells of InGaN layers and barriers of (Al)GaN layers. Various types of multiple quantum well structures are used such as InGaN/GaN for blue LEDs and GaN/AlGaN, InAlGaN/InAlGaN for ultraviolet LEDs. As for the efficiency of the active regions, the internal quantum efficiency $\eta i$ of the LED is improved by adjusting the light wavelength through variation of In or Al content or changing the depth of quantum wells in active regions, the number and thickness of active regions, and so on.

The mesa structures are of substantially equal four regions divided by the second region 108 of the n-doped semiconductor layer 104. The respective mesa structures have a first pair of diagonal corners (i.e., a pair of corners that are diagonally opposed to each other), which are curved inward to form the first basins 112 between two adjacent mesa structures, and a second pair of diagonally opposed corners, which are curved at their distal ends to form second basins 114 smaller than the first basins 112 between adjacent mesa structures. Accordingly, the LED 100 of the first embodiment has four first basins 112 and five second basins 114 each having an area smaller than that of the first basins 112. Four corners of each mesa structure are all rounded regardless of inward or outward roundness, and preferably have the same radius. This configuration is so designed to equalize the current density in the active regions. The current density equalization will be described later in the specification.

The four first metal layers 116 are formed on the p-doped semiconductor layers 108, covering the most portion thereof. As a result, the first metal layers 116 have a planar outline defined by the mesa structures including the p-doped semiconductor layers 110. That is, in each first metal layer 116, one pair of corners at side of the first basins 112 are rounded inward but the other pair of corners at the side of the second basins 114 are rounded outward at their ends. Also, the each first metal layer 116 is configured symmetric about a pair of diagonal corners.

The first metal layers 116 are formed via vapor deposition of metal and preferably function as anodes. The first metal layers 116 also function to reflect light generated from the active regions toward the sapphire substrate 102, and thus are preferably made of Ag or Al having a high reflectance, and more preferably made of Ag.

The second metal layer 118 is formed on the second region 108 of the n-doped semiconductor layer 104 to divide the first metal layers 116 into four separate sections. The second metal layer 118 itself is connected together into one structure. The second metal layer 118 functions preferably as a cathode, and is formed via vapor deposition of metal such as TiAl or CrAu.

As not shown in the drawings, there may be thin films of for example Silicon Oxide ($SiO_2$) coated on surface portions of the n- and p-doped semiconductors 104 and 110 that are not covered with the first and second metal layers 116 and 118. The oxide thin films will be described later with reference to FIGS. 8E to 8H.

The p-contacts 120 formed on the respective first metal layers 116 function as current electrodes. On portions of the second metal layer 118 in the first basins 112, there are also formed n-contacts (not shown) functioning as current electrodes. The p-contacts 120 preferably form conductive interfaces to enhance the wettability between the first metal layers 116 and solder bumps (not shown).

Because the first metal layers 116 made of Ag or Al poorly wet with the solder bumps if the solder bumps are dispensed directly onto the first metal layers 116, the interposed p-contacts 120 function to enhance the wettability between the first metal layers 116 and the solder bumps. The conductive interfaces are typically called bonding metals, and preferably made of Au.

The second metal layer 118 made of TiAl or CrAu has a relatively fine wettability to the solder bumps. As a result, those portions of the second metal layer 118 corresponding to the first basins 112 form n-contacts without conductive interfaces.

In the afore-described LED 100 according to the first embodiment of the invention, the n-contacts are placed adjacent to a pair of corners of the respective p-contacts (120). That is, the n-contacts are formed in those portions of the second metal layer 118 in the first basins 112, placed adjacent to a pair of diagonal corners of the respective first metal layers 116. Since the respective first metal layers 116 have a symmetric configuration about a pair of adjacent n-contacts, surrounded by the second metal layers 118, carriers (i.e., electrons) from the second metal layer 118 uniformly flow in the active regions, i.e., light emitting regions between the n-doped semiconductor layer 104 and the p-doped semiconductor layers 110 and then into the first metal layers 116. Further, the respective mesa structures are curved with all corners to have a circular two-dimensional outline so that the active regions in the mesa structures have a circular two-dimensional outline. This circular planar outline also imparts uniform current density to the active regions.

Figure 5:
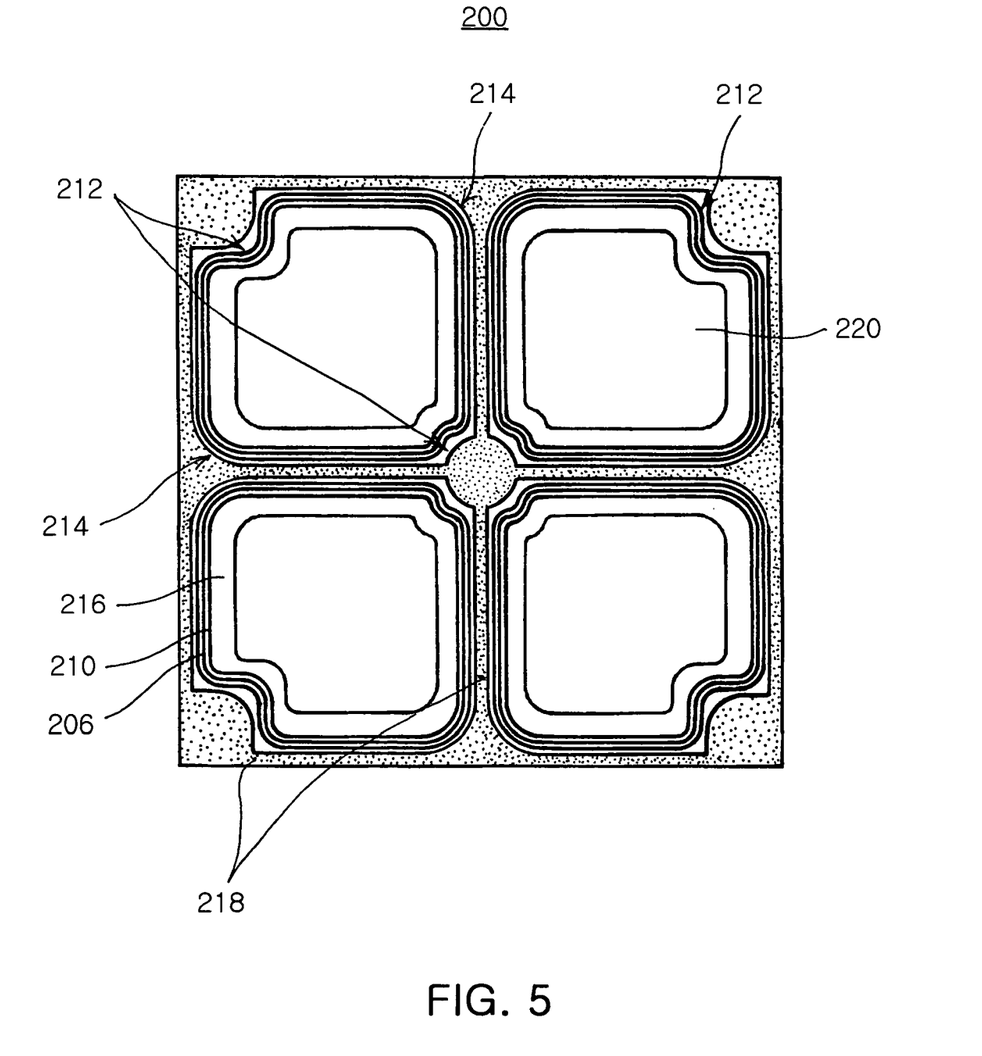
FIG. 5 is a plan view illustrating a flip chip LED according to a second embodiment of the invention.

FIG. 5 is a plan view illustrating a flip chip LED according to a second embodiment of the invention. Referring to FIG. 5, an LED 200 of the second embodiment is substantially equal with the LED 100 of the first embodiment except that five first basins 212 are formed in a central portion and four corners of the LED 200. Therefore, the parts having the same function are provided with the same reference numerals, increased by 100.

Also in this embodiment, respective n-contacts (not shown) are placed at side of a pair of diagonal corners of p-contacts 220. That is, two n-contacts are formed respectively in a second metal layer 218 in the first basins 212 corresponding to a pair of diagonal corners of each first metal layers 216. Since the each first metal layer 216 is configured symmetric about the two diagonal n-contacts and each active region in each mesa structure has a circular two-dimensional outline owing to the rounded corners, carriers (i.e., electrons) from the second metal layer 218 uniformly flow in active regions, i.e., light emitting regions between an n-doped semiconductor layer and p-doped semiconductor layers 210.

Figure 6:
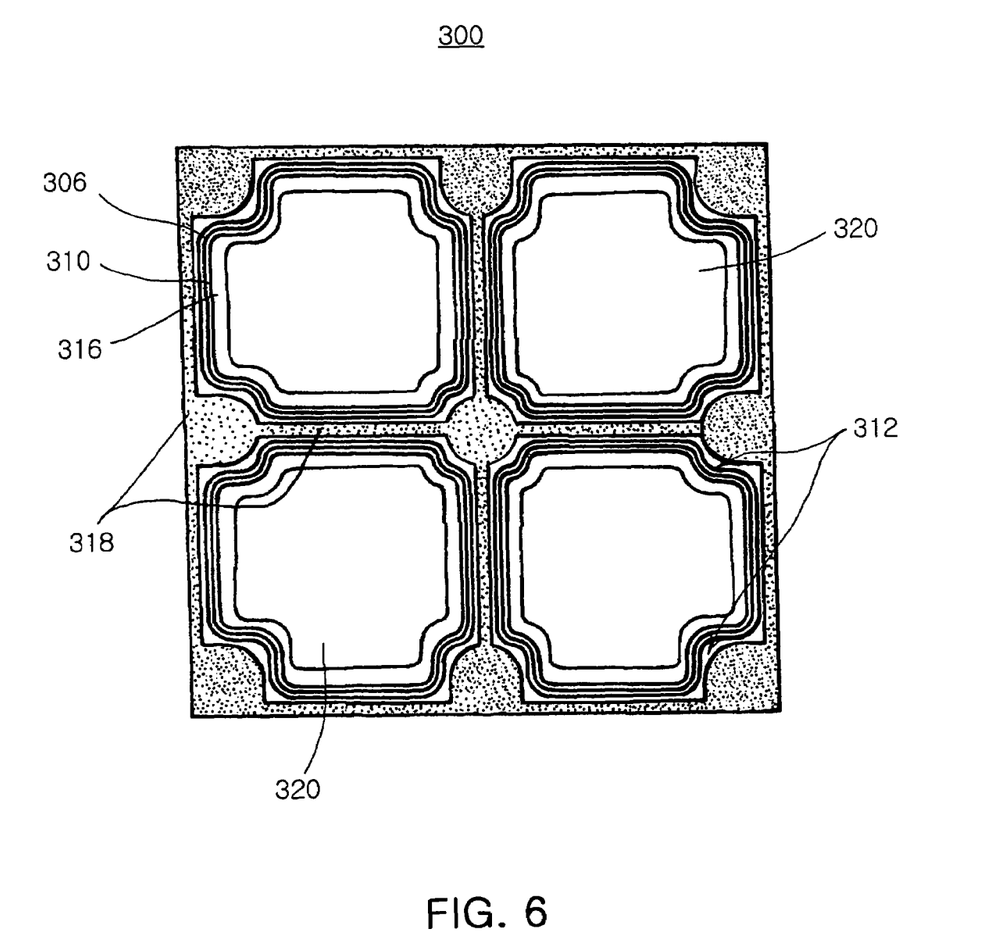
FIG. 6 is a plan view illustrating a flip chip LED according to a third embodiment of the invention.

FIG. 6 is a plan view illustrating a flip chip LED according to a third embodiment of the invention. Referring to FIG. 6, an LED 300 of the third embodiment is substantially equal with the LEDs 100 and 200 of the first and second embodiments except that n-contacts (not shown) are formed at four corners of first metal layers 316 (corresponding to basins 312). The parts of the LED 300 are designated with reference numerals in 300s.

In the LED 300 of the third embodiment, the n-contacts are placed at four corners of p-contacts. That is, each mesa structure is rounded inward with its four corners to form basins 312 for containing the n-contacts of a second metal layer 318. Therefore, since each first metal layer 316 is configured symmetric about the n-contacts and placed more adjacent to the n-contacts, carriers (i.e., electrons) from the second metal layer 318 more uniformly flow in active regions, i.e., light emitting regions between first regions 306 of an n-doped semiconductor layer and p-doped semiconductor layers 310.

Figure 7:
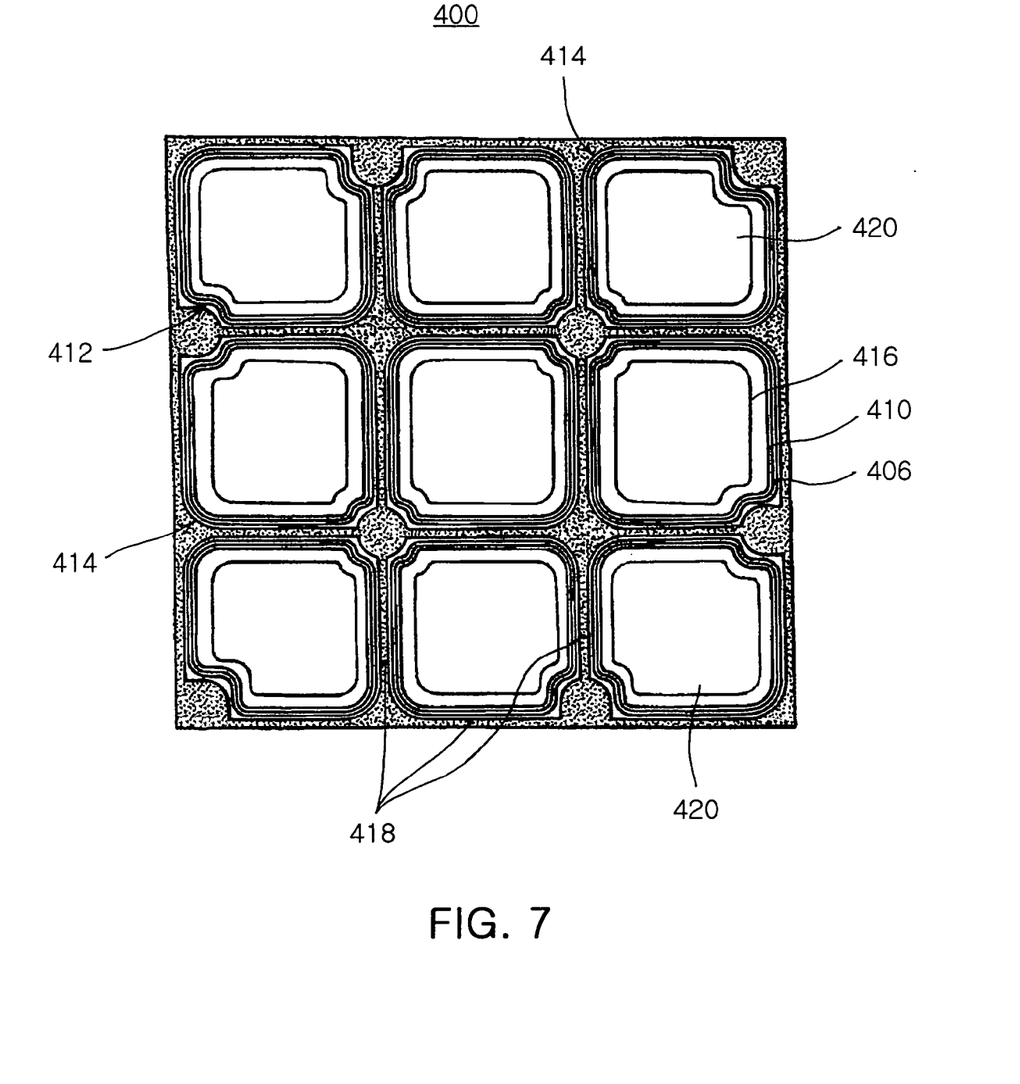
FIG. 7 is a plan view illustrating a flip chip LED according to a fourth embodiment of the invention.

FIG. 7 is a plan view illustrating a flip chip LED according to a fourth embodiment of the invention. Referring to FIG. 7, an LED 400 of the fourth embodiment has a combined configuration of the LED 100 of the first embodiment and the LED 200 of the second embodiment. That is, first basins 412 are formed at the side of a pair of diagonal corners of a pair of mesa structures, and second basins 414 smaller than the first basins 412 are formed at the side of another pair of diagonal corners of the pair of mesa structures.

This structure also has n-contacts placed at the side of a pair of diagonal corners of each p-contact. That is, the n-contacts are formed in a second metal layer 418 in the first basins 412 of the mesa structures, corresponding to the pair of diagonal corners of first metal layers 416 that are formed respectively on the mesa structures. Therefore, since the each first metal layer 416 is configured symmetric about the two diagonal n-contacts and each active region in each mesa structure has a circular two-dimensional outline owing to the rounded corners, carriers (i.e., electrons) uniformly flow in active regions, i.e., light emitting regions between an n-doped semiconductor layer and p-doped semiconductor layers 410.

If the LED 400 of the fourth embodiment has the same surface area as that of the LED 100 or 200 of the first or second embodiment, the each first metal layer 416 of the fourth embodiment has a smaller area than the each first metal layer 116 of 216 of the first or second embodiment. As a result, the LED 400 of the fourth embodiment has an advantage of more uniform carrier flow in the active regions than in the first or second embodiment.

Hereinafter a fabrication process of LEDs according to the present invention will be described based upon the LED 100 of the first embodiment in conjunction with FIGS. 8A to 8I.

Figure 8A:
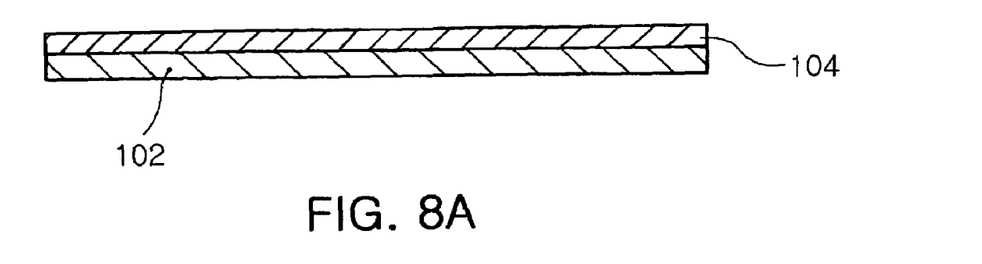
FIGS. 8A to 8I are stepwise sectional views illustrating a fabrication process of a flip chip LED of the invention.

Referring to FIG. 8A first, a substrate 102 having suitable dimensions and made of for example sapphire is prepared, a buffer layer (not shown) is formed on the substrate 102 via for example vapor deposition, and then an n-doped semiconductor layer 104 is grown on a resultant structure to a predetermined thickness. The n-doped semiconductor layer 104 is preferably made of n-doped GaN.

Figure 8B:
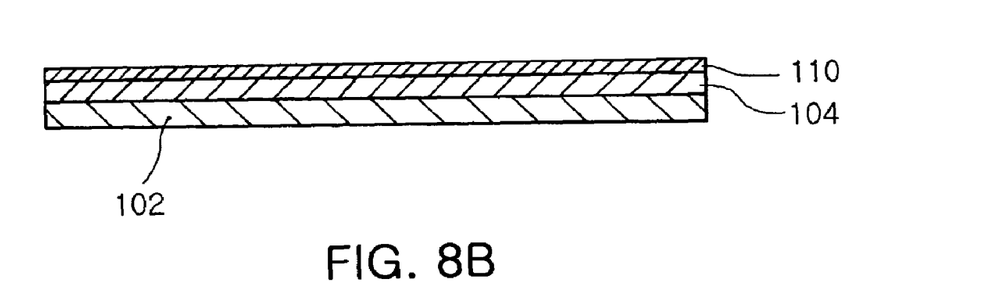

Then, as shown in FIG. 8B, a p-doped semiconductor layer 110 is formed on the n-doped semiconductor layer 104 to a predetermined thickness via for example vapor deposition. The p-doped semiconductor layer 110 is preferably made of p-doped GaN.

Figure 8C:
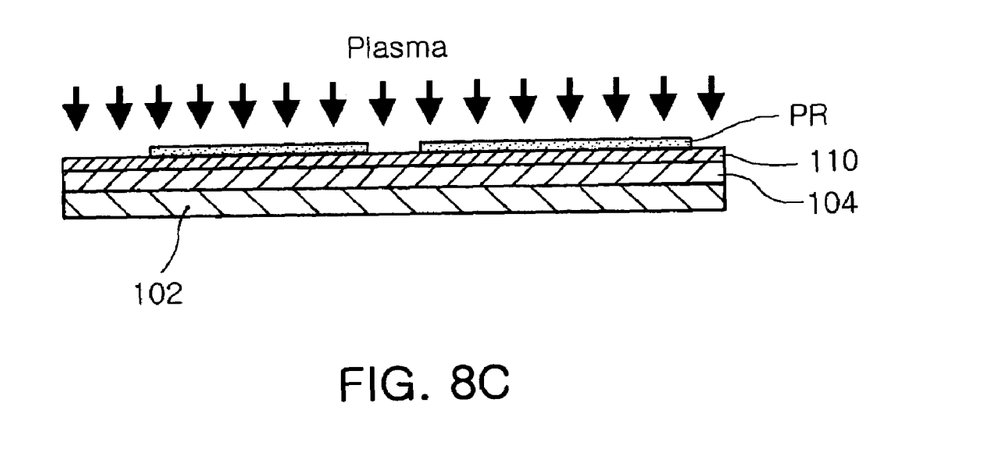
Figure 8D:
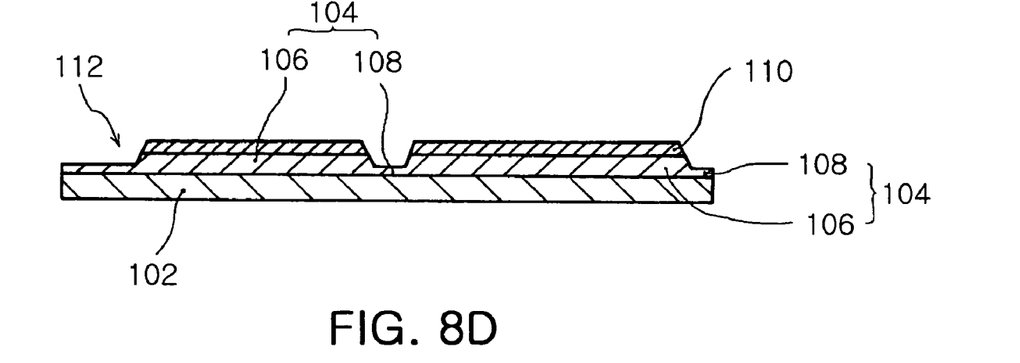

A photoresist PR of a desired pattern is covered on the p-doped semiconductor layer 110, and used as a mask to dry etch a resultant structure with plasma as shown in FIG. 8C. This step dry etches a portion of the p-doped semiconductor layer 110 through the opened pattern of the photoresist PR so as to expose at least a second region 108 of the n-doped semiconductor layer 104 as in shown FIG. 8D. The dry etching is performed to the extent of exposing at least the second region 108 of the n-doped semiconductor layer 104 so that the second region 108 of the n-doped semiconductor layer 104 is trenched as shown in FIG. 8D. Alternatively, the dry etching may be performed to the extent that the second region 108 becomes substantially flush with first regions 106.

Instead of those shown in FIGS. 8B and 8C, after the growth of an n-doped semiconductor layer 104, a photoresist of a predetermined pattern may be covered thereon to selectively form p-doped semiconductor layers 110 through openings in the photoresist.

Figure 8E:
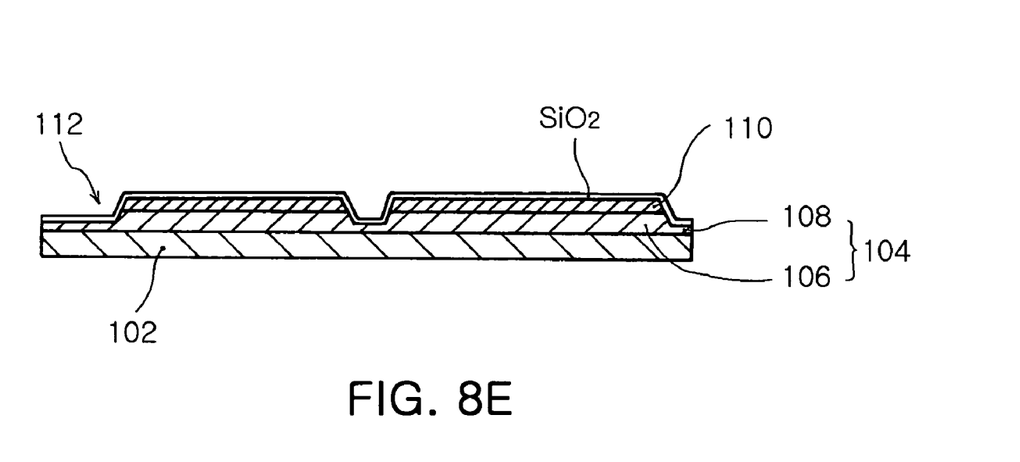

In FIG. 8E, an oxide thin film such as Silicon Oxide (SiO$_2$) is coated across the upper surface of a resultant structure obtained in FIG. 8D.

Figure 8F:
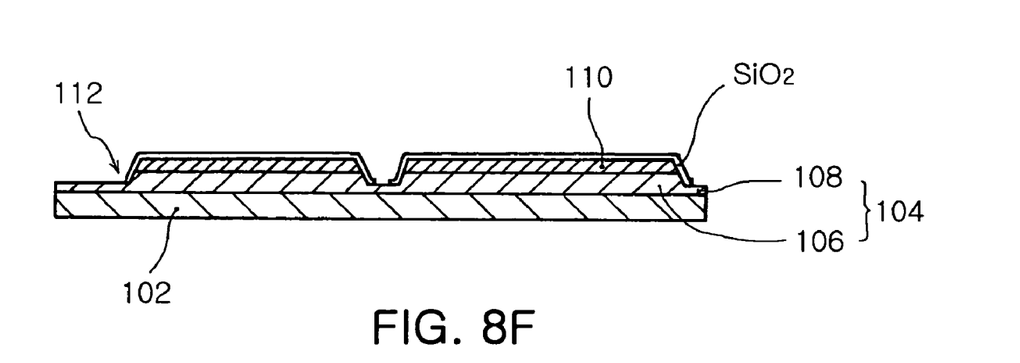

Then, a portion of SiO$_2$ film is etched from the second region 108 of the n-doped semiconductor layer 104 in a fashion similar to in FIG. 8C to expose the second region 108 as shown in FIG. 8F.

Figure 8G:
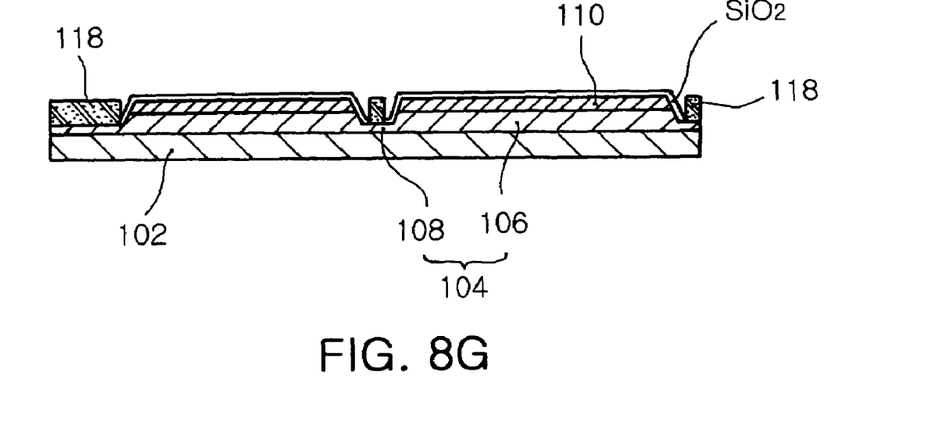

In FIG. 8G, a second metal layer 118 is coated on the exposed second region 108 via for example vapor deposition. The second metal layer 118 is preferably made of TiAl or CrAl.

Figure 8H:
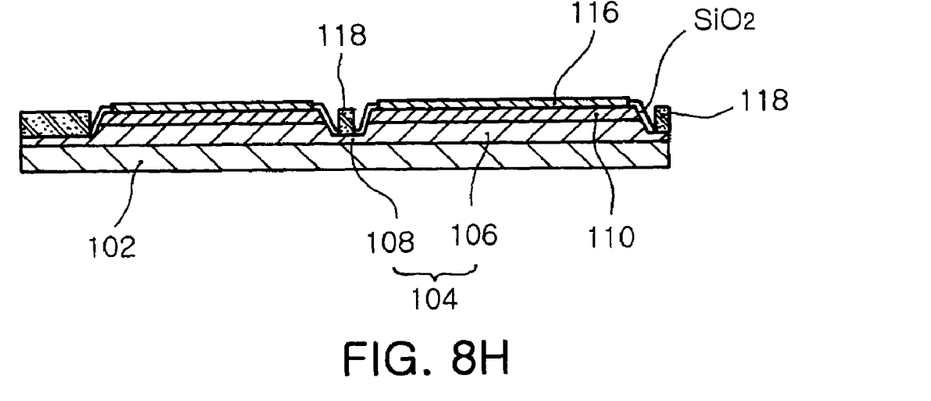

Then, the residual SiO$_2$ film is etched from the p-doped semiconductor layer 110 with for example plasma, and then first metal layers 116 are deposited on the exposed regions of the p-doped semiconductor layer 110. The first metal layers 116 are preferably made of one selected from the group including Ag, Al and alloy thereof, and more preferably made of Ag.

Figure 8I:
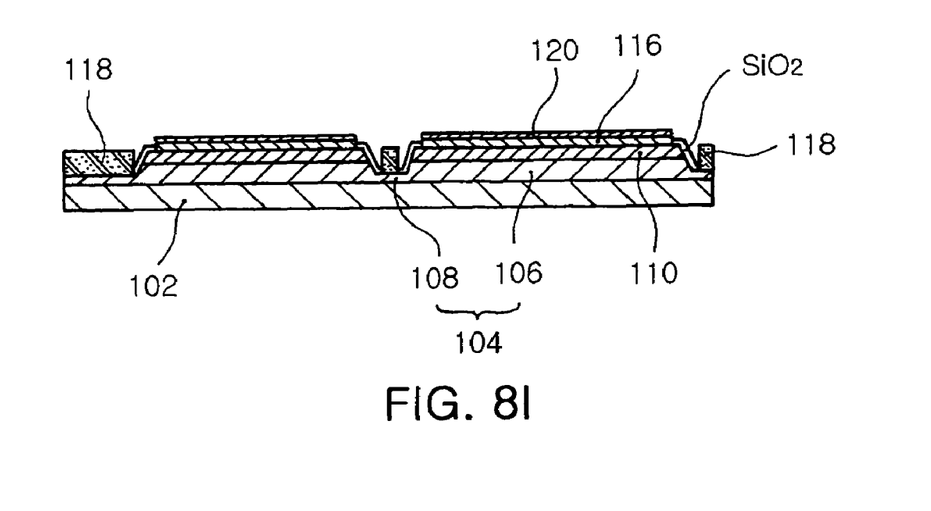

Then, as shown in FIG. 8I, p-contacts 120 as conductive interfaces are formed on the first metal layers 116. The conductive interfaces are typically called bonding metals, and preferably made of Au.

A resultant LED structure as shown in FIG. 8I is provided with the p-contacts 120 on the first metal layers 116 and n-contacts (not shown) in the second metal layer 118 thereby to produce the LED 100 as shown in FIGS. 2 to 4.

The afore-described high power flip chip LED of the present invention can prevent the current channeling to increase the luminous area while equalizing the current density across the luminous area thereby generating high brightness light.

Furthermore, the first metal layers as anodes function as heat sinks so that heat can be efficiently radiated from the LED.

Although the invention has been shown and described with reference to certain preferred embodiments thereof, it will be understood by those skilled in the art that various changes in form and details may be made therein without departing from the spirit and scope of the invention as defined by the appended claims.

What is claimed is:

1. A high power flip chip Light Emitting Diode (LED) comprising:
   a rectangular sapphire substrate;
   an n-doped semiconductor layer formed on the sapphire substrate, and having a plurality of first regions and a second region of intersecting lines extended through the first regions to separate the first regions from each other;
   a plurality of p-doped semiconductor layers formed respectively on the first regions of the n-doped semiconductor layer to form mesa structures having corners, at least one pair of diagonal corners of the respective mesa structures being rounded inward to form first basins between adjacent inward-rounded corners;
   first metal layers formed respectively on the mesa structures in a same configuration;
   a second metal layer formed on the second region of the n-doped semiconductor layer;
   a plurality of first ohmic contacts formed respectively on the first metal layers; and
   a plurality of second ohmic contacts formed respectively on the second metal layer in the first basins.

2. The high power flip chip LED according to claim 1, wherein remaining corners of the mesa structures are rounded to form second basins.

3. The high power flip chip LED according to claim 2, wherein the first and second basins have a same radius.

4. The high power flip chip LED according to claim 2, wherein the second basins have a same radius.

5. The high power flip chip LED according to claim 1, wherein the first basins have a same radius.

6. The high power flip chip LED according to claim 1, wherein the first metal layers are configured symmetric about each pair of diagonal corners.

7. The high power flip chip LED according to claim 1, wherein the second metal layer is integrally formed around the first metal layers.

8. The high power flip chip LED according to claim 1, wherein the sapphire substrate is replaced by one selected from a group including a SiC substrate, an oxide substrate and a carbide substrate.

9. A high power flip chip Light Emitting Diode (LED) comprising:
   a rectangular sapphire substrate;
   an n-doped semiconductor layer formed on the sapphire substrate, and having a plurality of first regions and a second region of intersecting lines extended through the first regions to separate the first regions from each other;
   a plurality of p-doped semiconductor layers formed respectively on the first regions of the n-doped semiconductor layer to form mesa structures having corners, all of the corners being rounded inward to form basins;
   first metal layers formed respectively on the mesa structures in a same configuration;
   a second metal layer formed on the second region of the n-doped semiconductor layer;

a plurality of first ohmic contacts formed respectively on the first metal layers; and a plurality of second ohmic contacts formed respectively on the second metal layer in the first basins.

10. The high power flip chip LED according to claim 9, wherein the basins have a same radius.

11. The high power flip chip LED according to claim 9, wherein the first metal layers are configured symmetric about each pair of diagonal corners.

12. The high power flip chip LED according to claim 9, wherein the second metal layer is integrally formed around the first metal layers.

13. The high power flip chip LED according to claim 9, wherein the sapphire substrate is replaced by one selected from a group including a SiC substrate, an oxide substrate and a carbide substrate.

* * * * *